(12) United States Patent
Blonkowski et al.

(10) Patent No.: US 8,866,062 B2
(45) Date of Patent: Oct. 21, 2014

(54) DEVICE AND METHOD FOR MEASURING LIGHT ENERGY RECEIVED BY AT LEAST ONE PHOTOSITE

(75) Inventors: Serge Blonkowski, Meylan (FR); Diana Lopez, Grenoble (FR)

(73) Assignees: STMicroelectronics SA, Montrouge (FR); STMicroelectronics (Crolles 2) SAS, Crolles (FR)

( * ) Notice: Subject to any disclaimer, the term of this patent is extended or adjusted under 35 U.S.C. 154(b) by 305 days.

(21) Appl. No.: 13/402,288

(22) Filed: Feb. 22, 2012

(65) Prior Publication Data

US 2012/0211646 A1 Aug. 23, 2012

(30) Foreign Application Priority Data

Feb. 23, 2011 (FR) ..................... 11 51473

(51) Int. Cl.
  H01L 27/00 (2006.01)
  H01L 31/0392 (2006.01)
  H01L 31/0376 (2006.01)
  H01L 27/146 (2006.01)
  H01L 31/20 (2006.01)

(52) U.S. Cl.
  CPC ..... H01L 27/14612 (2013.01); *H01L 31/03921* (2013.01); *H01L 31/03767* (2013.01); *H01L 27/14679* (2013.01); *H01L 27/14603* (2013.01); *H01L 31/202* (2013.01); *H01L 27/14692* (2013.01); *H01L 27/1462* (2013.01); *H01L 27/14665* (2013.01)
  USPC ........ 250/214.1; 250/208.1; 250/57; 250/461

(58) Field of Classification Search
  USPC .......... 250/208.1, 214.1, 214 R; 257/57, 290, 257/292, 461
  See application file for complete search history.

(56) References Cited

U.S. PATENT DOCUMENTS

| | | | |
|---|---|---|---|
| 4,933,731 A | 6/1990 | Kimura | |
| 2005/0269606 A1 | 12/2005 | Mouli | |
| 2006/0043520 A1 | 3/2006 | Jerdev et al. | |
| 2006/0249765 A1* | 11/2006 | Hsieh | ............................ 257/292 |
| 2009/0200589 A1 | 8/2009 | Qian et al. | |

FOREIGN PATENT DOCUMENTS

WO 2009-028804 A2 3/2009

OTHER PUBLICATIONS

Stutzmann et al., "Kinetics of the Staebler-Wronski effect in hydrogenated amorphous silicon," Appl. Phys. Lett. 45 (10), Nov. 15, 1984, pp. 1075-1077, Palo Alto, California.

* cited by examiner

*Primary Examiner* — Kevin Pyo
(74) *Attorney, Agent, or Firm* — Allen, Dyer, Doppelt, Milbrath & Gilchrist, P.A.

(57) ABSTRACT

A method is for measuring light energy received by a pixel including a transfer transistor, and a photodiode including a charge storage region. The method may include encapsulating the gate of the transfer transistor of the pixel in a semiconductor layer, at least one part of which includes a hydrogenated amorphous semiconductor. The method also may include grounding the charge storage region of the pixel, and determining the drift over time in the magnitude of the drain-source current of the transfer transistor.

19 Claims, 2 Drawing Sheets

DEVICE AND METHOD FOR MEASURING LIGHT ENERGY RECEIVED BY AT LEAST ONE PHOTOSITE

FIELD OF THE INVENTION

The invention relates to imaging devices, and more particularly, to a device for measuring light energy received by at least one photosite.

BACKGROUND OF THE INVENTION

An imaging device, or sensor, is a photosensitive electronic component used to covert electromagnetic radiation into an analog electrical signal. Generally, this signal is then amplified, digitized by an analog/digital converter, and finally processed so as to obtain a digital image. In this case, the imaging device makes use of the photoelectric effect, whereby incident photons liberate electrons at a semiconductor junction in each active element. To do this, a photosite (e.g. pixel) comprises at least one photosensitive region, for example, a photodiode, and a reading region coupled to the photodiode via a charge transfer transistor.

SUMMARY OF THE INVENTION

According to an embodiment, a device having a reduced size is provided for measuring light energy received by at least one photosite (pixel).

According to an aspect, a method is provided for measuring the light energy received by at least one pixel comprising a transfer transistor, and a photodiode comprising a charge storage region. The method may include encapsulating the gate of the transfer transistor of the pixel in a semiconductor layer. At least one part of the semiconductor layer may comprise a hydrogenated amorphous semiconductor. The method also may include grounding the charge storage region of the pixel, and determining the drift over time in the magnitude of the drain-source current of the transfer transistor.

It has been observed that the material used to encapsulate the transfer transistor causes the current to drift in time. The article "Kinetics of the Staebler-Wronski effect in hydrogenated amorphous silicon" by M. Stutzmann et al., published in the journal Applied Physics Letters 45 (10), 15 Nov. 1984, presents a quantification of the generation of defects in the material in time and as a function of the power of the illuminating light.

The Staebler-Wronski effect is the origin of the current drift. Specifically, exposing the material encapsulating the transfer transistor to light generates positive charges in the material. The drift of the transistor then results from field-effect depletion of the implanted p-doped surface of the photodiode. This depletion may modify the effective doping of this p-doped region of the photodiode, and therefore, reduces the input resistance of the transistor and leads to modified conduction.

This degradation effect (drift of the current in time) may be a disadvantage in an imaging device and may be removed. However, it may be observed that it is possible to use this degradation effect in combination with grounding the charge storage region to determine the light energy received by the pixel.

Grounding the charge storage region may enable a potential difference to be maintained between the photodiode and the gate of the transfer transistor when the potential of the latter is allowed to float. The potential difference may lead to the appearance of an electric field in the encapsulating material. When charge is created by illuminating the encapsulating layer, the electric field may induce a force preventing charge recombination, i.e. positive charge accumulating above the photodiode. This being so, to obtain a better electric field, the gate of the transfer transistor may be preferably biased with a bias voltage, for example, about 1 volt, the value of this voltage possibly varying however depending on the size of the gate.

The more powerful the illumination is and the longer it is applied for, the greater the number of charge carriers generated and the larger the current drift in time may be. Although it is possible to use germanium, the hydrogenated amorphous semiconductor preferably May comprise hydrogenated amorphous silicon. Hydrogenated amorphous silicon may make it possible to maximize the number of dangling bonds and therefore the amount of charge generated under exposure to light, relative to other hydrogenated amorphous semiconductors.

Hydrogenated amorphous silicon may be obtained by plasma-enhanced chemical vapor deposition (PECVD) using a silane ($SiH_4$) precursor. The chemical deposition may be carried out at a low temperature so that amorphous silicon is deposited.

Although it is possible to use a high proportion of hydrogen, hydrogenated amorphous silicon comprising between 1% and 10% hydrogen (by atomic percentage) may be used. This is because such a percentage range may allow an amorphous structure and therefore a large amount of weak bonds (source of the charge that generates the current drift) to be obtained more easily. The drift of the current in time may therefore be greater.

The hydrogen of the hydrogenated amorphous silicon may be replaced with deuterium. Since deuterium is a naturally occurring isotope of hydrogen, the expression "hydrogenated amorphous silicon" includes the case where deuterium is used instead of hydrogen. The hydrogenated amorphous semiconductor material may also be doped, with carbon or with nitrogen, for example, so as to obtain compounds such as a-$Si_xN_yH_z$ or a-$Si_xC_yH_z$ ("a" standing for amorphous).

Determining the drift of the magnitude of the drain-source current of the transfer transistor in time may comprise measuring the magnitude of the drain-source current of the transfer transistor and comparing the measured magnitude to a reference magnitude. The pixel may comprise a reading node, and the magnitude of the drain-source current of the transfer transistor may be advantageously measured using the image current measured at the reading node.

Advantageously, the method may comprise storing the initial magnitude measured for the pixel when it is not exposed to light, this measured magnitude forming the reference magnitude. The method may also comprise resetting the measurement by applying a resetting potential to the gate of the transfer transistor, reversing the direction of the electric field between the gate of the transfer transistor and the photodiode relative to the electric field under normal operation, and storing the magnitude measured after the reset, this measured magnitude forming the reference magnitude.

According to another aspect, a device is provided for measuring the light energy received by at least one pixel, formed in a semiconductor substrate, comprising a transfer transistor, and a photodiode comprising a grounded charge storage region. The transfer transistor may be at least partially encapsulated in a hydrogenated amorphous semiconductor. The device may also include processing means or a processor able to determine the drift of the magnitude of the drain-source current of the transfer transistor in time. The hydrogenated amorphous semiconductor may comprise hydrogenated amorphous silicon, for example.

In some embodiments, the pixel may comprise a reading node, and the processor comprising measuring means or a measuring module coupled to the reading node and comparing means or a comparator able to compare the magnitude of the measured current to a reference magnitude. Advantageously, the comparator may comprise a memory able to store the reference magnitude, the reference magnitude corresponding to the magnitude of the drain-source current of a transfer transistor of a pixel when it is not exposed to light.

The device may also comprise reset-control means or a reset-control module able to apply a potential to the gate of the transfer transistor reversing the direction of the electric field between the gate of the transfer transistor and the photodiode relative to the electric field under nominal operation. Advantageously, the processor may be coupled to the reset module, the reset module being able to control, after the pixel has been reset, measurement of the drain-source current and storage in the memory of the magnitude measured after the reset as a reference magnitude. The device may advantageously comprise a plurality of the pixels coupled in parallel so as to increase its sensitivity.

BRIEF DESCRIPTION OF THE DRAWINGS

Other advantages and features of the invention may become clear on examining the detailed description of non-limiting embodiments and the annexed drawings in which.

DETAILED DESCRIPTION OF THE PREFERRED EMBODIMENTS

Figure 1:
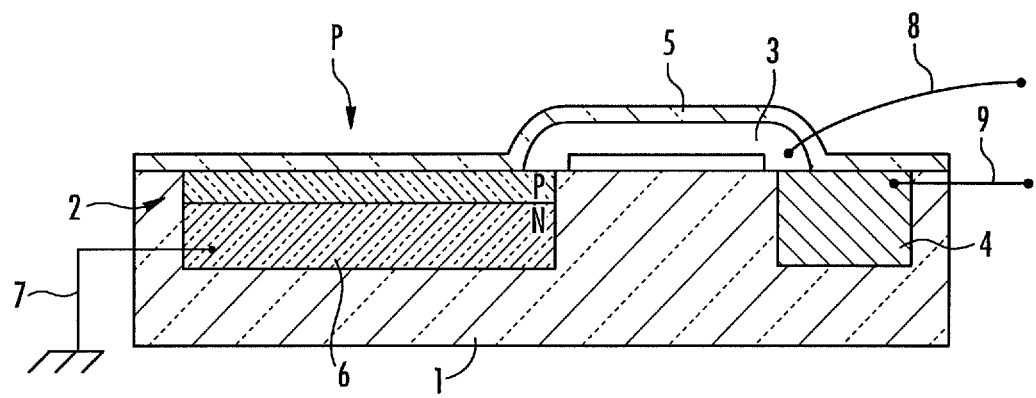
FIG. 1 is a schematic diagram of a pixel of a device for measuring energy received by the pixel, according to the present invention.

FIG. 1 shows a pixel P of a device for measuring energy received by the pixel P according to one embodiment. The pixel P formed in a semiconductor substrate 1 comprises a photodiode 2 comprising at least one p-n junction, a transfer transistor 3, and a reading node 4.

The transfer transistor 3 is coupled on the one hand to the photodiode 2 and on the other hand to the reading node 4. The transfer transistor 3 is encapsulated in a layer 5 of hydrogenated amorphous silicon. This layer 5 of hydrogenated amorphous silicon may cover the entire surface of the pixel P or just part of the gate of the transfer transistor 3.

The photodiode 2 comprises a charge storage region 6 able to store the charge created via the photoelectric effect in the photodiode. The current created by this charge is removed by grounding the charge storage region 6 via an electrical connection 7, such as a metal contact.

The gate of the transfer transistor 3 is coupled via an electrical connection 8, such as a metal contact, for example, to bias-control means or a module able to apply a bias potential, $V_{TG}$, (for example, about one volt) to the gate of the transfer transistor under normal operation and an inverse potential, $-V_{TG}$, during a reset step. Moreover, to measure the drift of the drain-source current of the transfer transistor 3 in time, the reading node 4 is coupled to processor T, shown in FIG. 2, via an electrical connection 9, such as a metal contact, for example.

Figure 2:
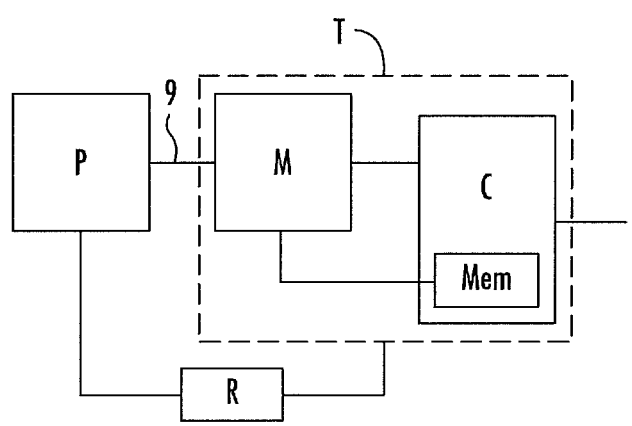
FIG. 2 is a schematic diagram of a device for measuring light energy received by a pixel, according to the present invention.

FIG. 2 shows a device for measuring light energy received by at least one pixel P of the type illustrated in FIG. 1. The device comprises a processor T comprising a measuring module M and a comparator C. After a period of exposure, the measuring module M delivers the measurement of the magnitude of the drain-source current of the transfer transistor of the pixel P. Measurement of the magnitude of the drain-source current of the transfer transistor is carried out at the reading node 4 via the electrical connection 9.

The magnitude measured by the measuring module M is then delivered to the comparator C, which compares the magnitude to a reference magnitude initially stored in a memory Mem. The comparator C then delivers as output the light energy corresponding to the difference between the measured current magnitude and the reference current magnitude. By way of non-limiting example, the measuring module and the comparator may comprise a subtractor coupled to the reading node and to the reference magnitude and delivering an output representative of the light energy received.

The reference magnitude may be stored at the factory. It corresponds to the magnitude of the drain-source current in the pixel when it is not exposed to light. The device also comprises a reset module R making it possible to reset the measurement. The pixel P is reset by controlling application of a potential ($-V_{TG}$) to the gate of the transfer transistor 3, the potential being inverted relative to the nominal operating potential ($V_{TG}$). The reset module R is also coupled in this embodiment to the processor T in order to control measurement of the magnitude of the drain-source current after a reset step and the storage of this measurement as the reference magnitude.

Figure 3:
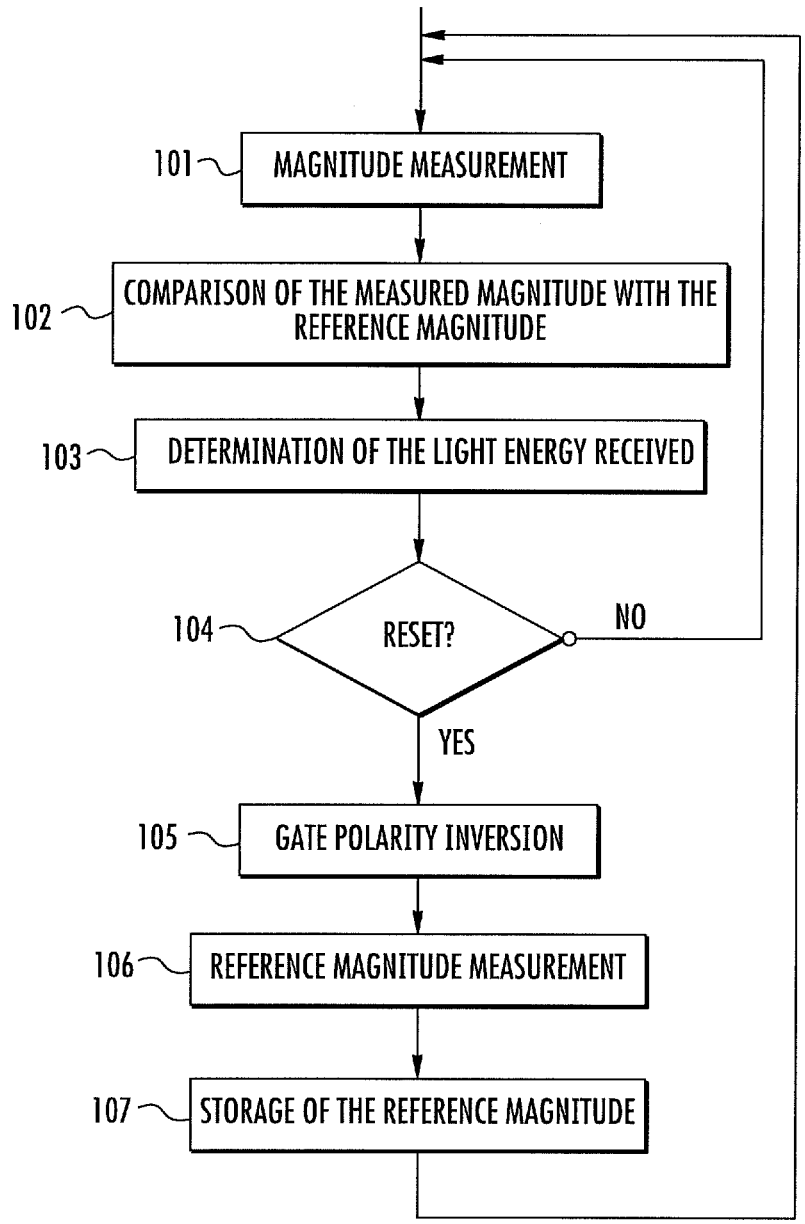
FIG. 3 is a flowchart of a method for measuring light energy received by a pixel, according to the present invention.

FIG. 3 shows a flowchart of a method for measuring the light energy received by the pixel P of FIGS. 1 and 2. Hydrogenated amorphous silicon has the physical property of creating dangling bonds when it is illuminated. This is because the bonds of an amorphous semiconductor are weak because of the disorganized nature of its atoms. In hydrogenated amorphous silicon, the weak bonds may be broken under illumination and form dangling bonds (Staebler-Wronski effect). These dangling bonds become positively charged by capturing photogenerated holes.

Grounding the storage region 6 allows the charge created via the photoelectric effect in the semiconductor p-n junction of the photodiode 2 to be removed. Thus, no charge is stored in the charge storage region 6.

Moreover, the photodiode 2 of the pixel P is biased to a potential and the transfer transistor 3 is biased to a different potential. The potential difference creates an electric field in the encapsulating hydrogenated amorphous silicon, thereby preventing electron-hole recombination and thus promoting hole capture by the dangling bonds facing the photodiode. This results in an accumulation of positive charge in the hydrogenated-amorphous-silicon layer 5 in the region opposite the photodiode 2.

To determine the drift of the magnitude of the drain-source current of the transfer transistor 3 in time, the magnitude of the drain-source current of the transfer transistor 3 is measured, in a first step 101, using the measuring module M coupled to the reading node 4 of the pixel P.

The measured current therefore corresponds to the drift in the drain-source current that can be observed in a imaging device, i.e. to the additional current component due to the modification of the input resistance induced by positive charge stored in the hydrogenated-amorphous-silicon layer 5 opposite the photodiode 2. In the next step 102, the measured magnitude of the drain-source current is compared with a reference magnitude. This comparison makes it possible, in a final step 103, to determine the light energy received by at least one pixel P during the total time spent exposed to the light.

In the step 104, it is possible to reset the device. If the reset is not requested, the method returns to step 101 and the capture of light energy continues. The following measurement may therefore integrate the light energy already received by the pixel P.

If the reset is requested, a potential $-V_{TG}$ is applied to the gate of the transfer transistor 3, in step 105, this potential $-V_{TG}$ being the inverse of the potential $V_{TG}$ applied to the gate of the transfer transistor 3 during nominal operation of the device (steps 101 to 103). Applying such a potential, which reverses the electric field in the hydrogenated-amorphous-silicon layer 5, promotes electron/hole recombination under illumination and therefore reduces the charge due to capture of holes by dangling bonds. The input resistance of the transistor then returns to its initial value.

In the next step 106, the drain-source current is measured and the measured value is stored, in step 107, as the reference magnitude. This measurement of the reference magnitude makes it possible to calibrate the device if all the charge has not been cancelled out by the recombination process. After the storage step 107, the method may return to the first step 101. The new measurement carried out in step 101 may not integrate the light energy received previously by the at least one pixel P.

A device for measuring light energy received by at least one pixel may make it possible to measure the light energy received over a long period of time by a piece of hardware, such as an image sensor of a digital camera, or by a biological substance sensitive to light such as the skin, or a food product. It is thus possible to monitor the amount of light received by a perishable foodstuff, or even to reset an image sensor of a camera after prolonged exposure to light.

Another application may include in coupling the device for measuring light energy received by at least one pixel P to a timing mechanism, for example, a clock signal generator. In this way, by combining the two items of information obtained (the light energy received and the exposure time), it is possible to calculate the average power corresponding to the measured exposure time.

That which is claimed is:

1. A method for measuring light energy received by at least one pixel comprising a transfer transistor, and a photodiode comprising a charge storage region, the transfer transistor being encapsulated in a semiconductor layer comprising a hydrogenated amorphous semiconductor, the method comprising:
   coupling the charge storage region of the pixel to a reference voltage; and
   determining a drift over time in a drain-source current of the transfer transistor by at least measuring a value of the drain-source current of the transfer transistor, and comparing the measured value to a reference value.

2. The method according to claim 1 wherein the hydrogenated amorphous semiconductor comprises a hydrogenated amorphous silicon.

3. The method according to claim 1 wherein the hydrogenated amorphous silicon comprises between 1% and 10% hydrogen.

4. The method according to claim 1 further comprising generating an electric field between the photodiode and a gate terminal of the transfer transistor by biasing the gate terminal of the transfer transistor with a bias voltage.

5. The method according to claim 1 wherein the pixel comprises a reading node; and wherein the value of the drain-source current of the transfer transistor is measured using an image current measured at the reading node.

6. The method according to claim 1 further comprising storing an initial value measured for the at least one pixel when not exposed to light, the initial value being the reference value.

7. The method according to claim 4 further comprising:
   resetting a measurement by applying a reset voltage to the gate terminal of the transfer transistor;
   reversing a direction of the electric field between the gate terminal of the transfer transistor and the photodiode; and
   storing a value measured after the reset, the measured value being a reference value.

8. A method for measuring light energy received by at least one pixel comprising a transfer transistor, a photodiode comprising a charge storage region, and a reading node, the transfer transistor being encapsulated in a semiconductor layer comprising a hydrogenated amorphous silicon, the method comprising:
   coupling the charge storage region of the pixel to a reference voltage; and
   determining a drift over time in a drain-source current of the transfer transistor using an image current measured at the reading node by at least measuring a value of the drain-source current of the transfer transistor, and comparing the measured value to a reference value.

9. The method according to claim 8 wherein the hydrogenated amorphous silicon comprises between 1% and 10% hydrogen.

10. The method according to claim 8 further comprising generating an electric field between the photodiode and a gate terminal of the transfer transistor by biasing the gate terminal of the transfer transistor with a bias voltage.

11. A device for measuring received light energy comprising:
    a semiconductor substrate;
    at least one pixel formed in said semiconductor substrate and comprising
    a transfer transistor,
    a photodiode coupled to said transfer transistor and comprising a charge storage region,
    a hydrogenated amorphous semiconductor layer at least partially encapsulating said transfer transistor, and
    a reading node coupled to said transfer transistor; and
    a processor comprising a measuring module coupled to said reading node, and a comparator configured to compare a drain-source current to a reference value for determining a drift of the drain-source current of said transfer transistor in time.

12. The device according to claim 11 wherein said comparator comprises a memory configured to store the reference value, the reference value corresponding to a drain-source current of said transfer transistor when not exposed to light.

13. The device according to claim 11 wherein said transfer transistor comprises a gate terminal; and further comprising a reset-control module configured to control application of a bias voltage to said gate terminal for reversing a direction of an electric field between said gate terminal of said transfer transistor and said photodiode.

14. The device according to claim 13 wherein said processor is coupled to said reset-control module, said reset-control module configured to control, after said at least one pixel has been reset, measurement of the drain-source current and storage in said memory of the value measured after the reset as a reference value.

15. The device according to claim 11 wherein said at least one pixel comprises a plurality thereof connected in parallel.

16. A device for measuring received light energy comprising:
- a semiconductor substrate;
- at least one pixel formed in said semiconductor substrate and comprising
  - a transfer transistor,
  - a photodiode coupled to said transfer transistor and comprising a charge storage region,
  - a hydrogenated amorphous silicon layer at least partially encapsulating said transfer transistor, and
  - a reading node coupled to said transfer transistor; and
- a processor configured comprising a measuring module coupled to said reading node, and a comparator configured to compare a drain-source current to a reference value for determining a drift of the drain-source current of said transfer transistor in time.

17. The device according to claim 16 wherein said comparator comprises a memory configured to store the reference value, the reference value corresponding to a drain-source current of said transfer transistor when not exposed to light.

18. The device according to claim 16 wherein said transfer transistor comprises a gate terminal; and further comprising a reset-control module configured to control application of a bias voltage to said gate terminal for reversing a direction of an electric field between said gate terminal of said transfer transistor and said photodiode.

19. The device according to claim 18 wherein said processor is coupled to said reset-control module, said reset-control module configured to control, after said at least one pixel has been reset, measurement of the drain-source current and storage in said memory of the value measured after the reset as a reference value.

* * * * *

UNITED STATES PATENT AND TRADEMARK OFFICE
CERTIFICATE OF CORRECTION

PATENT NO. : 8,866,062 B2  
APPLICATION NO. : 13/402288  
DATED : October 21, 2014  
INVENTOR(S) : Blonkowski et al.

Page 1 of 1

It is certified that error appears in the above-identified patent and that said Letters Patent is hereby corrected as shown below:

In the Claims

Column 5, Line 59    Delete: "claim 1"  
                     Insert: --claim 2--

Signed and Sealed this  
Seventh Day of July, 2015

Michelle K. Lee  
*Director of the United States Patent and Trademark Office*